(12) United States Patent
Shimizu et al.

(10) Patent No.: US 6,269,462 B1
(45) Date of Patent: Jul. 31, 2001

(54) SELECTABLE SENSE AMPLIFIER DELAY CIRCUIT AND METHOD

(75) Inventors: Tadayuki Shimizu; Kunihiko Kozaru, both of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/192,460

(22) Filed: Nov. 16, 1998

(30) Foreign Application Priority Data

May 18, 1998 (JP) .................................................. 10-134704

(51) Int. Cl.$^7$ .................................................. G01R 31/28
(52) U.S. Cl. .......................... 714/727; 365/201; 365/194
(58) Field of Search .................... 714/727, 726; 365/63, 72, 194, 154, 189.01, 190, 205, 200, 233.5, 222, 182, 227, 201, 229, 212, 233, 196; 327/141, 262, 263, 276, 403; 257/211, 296; 326/105

(56) References Cited

U.S. PATENT DOCUMENTS

| | | | |
|---|---|---|---|
| 5,023,840 | 6/1991 | Tobita | 365/201 |
| 5,204,559 | 4/1993 | Deyhimy et al. | 307/480 |
| 5,305,265 * | 4/1994 | Shgibayashi | 365/194 |
| 5,430,681 * | 7/1995 | Sugawara et al. | 365/222 |
| 5,539,349 | 7/1996 | Roy | 327/276 |
| 5,602,855 * | 2/1997 | Whetsel, Jr. | 714/726 |
| 5,852,617 * | 12/1998 | Mote, Jr. | 714/726 |
| 5,869,979 * | 2/1999 | Bocchino | 326/38 |

FOREIGN PATENT DOCUMENTS

| | | | |
|---|---|---|---|
| 0 511 752 A1 | 11/1992 | (EP) | G06F/11/26 |
| 63-244494 | 10/1988 | (JP) . | |

* cited by examiner

*Primary Examiner*—Albert Decady
*Assistant Examiner*—Guy J. Lamarre
(74) *Attorney, Agent, or Firm*—McDermott, Will & Emery

(57) ABSTRACT

A semiconductor device includes a sense amplifier which becomes able to amplify a signal when receiving a read enable signal; a delay unit which can provide a plurality of transmission paths having different delay times and which propagates the read enable signal through a transmission path corresponding to a selection signal among the plurality of transmission paths; a selection signal generation circuit capable of generating the plurality of selection signals; and a JTAG boundary scan test circuit which brings the selection signal generation circuit into operation in accordance with a instruction.

11 Claims, 10 Drawing Sheets

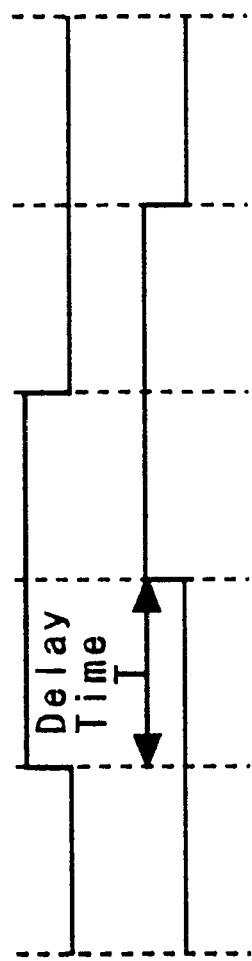
FIG. 10A Read Enable
FIG. 10B Node A
PRIOR ART

US 6,269,462 B1

SELECTABLE SENSE AMPLIFIER DELAY CIRCUIT AND METHOD

BACKGROUND OF THE INVENTION

1. Field of the Invention

The present invention generally relates to a semiconductor device, and to a method of designing the semiconductor device. More particularly, the present invention relates to a semiconductor device equipped with a sense amplifier which becomes operative when receiving a read enable signal, and to a method of designing the semiconductor device.

2. Description of the Background Art

There has been known a semiconductor device, e.g., a memory IC, equipped with a sense amplifier which becomes operative when receiving a read enable signal.

FIG. 9 is a circuit diagram showing a sense amplifier 10 and other elements provided for the existing semiconductor device. The sense amplifier 10 has a Data terminal 12 and a /Data terminal 14. The Data terminal 12 and the /Data terminal 14 are connected to an unillustrated Data line and an unillustrated /Data line, respectively. The Data line and the /Data line are transmission lines each of which receives Data or /Data signal from a corresponding memory cell when the address of the memory cell is designated.

The sense amplifier 10 has an output terminal 16 and an enable terminal 18. The sense amplifier is a differential amplifier which amplifies a voltage across the Data terminal 12 and the /Data terminal 14 and outputs the thus-amplified voltage from the output terminal 16 when receiving a read enable signal at the enable terminal 18. The enable terminal 18 of the sense amplifier 10 is connected to a delay circuit 20 formed from a plurality of inverter circuits connected in series.

FIGS. 10A and 10B are timing charts for explaining the operation of the delay circuit 20. FIG. 10A shows a waveform of the read enable signal supplied to the delay circuit 20 from an internal circuit of the semiconductor device. In contrast, FIG. 10B shows a waveform appearing at a node A shown in FIG. 9, i.e., the enable terminal 18 of the sense amplifier 10.

As shown in FIGS. 10A and 10B the delay circuit 20 supplies a read enable signal produced by the internal circuit of the semiconductor device to the enable terminal 18 of the sense amplifier 10 after a lapse of a predetermined delay time T. Accordingly, the sense amplifier 10 commences to amplify the Data signal when the predetermined delay time T has elapsed after the internal circuit of the semiconductor device has changed the enable signal from a low state to a high state.

In a semiconductor device, a certain length of time is required for the Data signal issued from the memory cell to reach the sense amplifier 10 after designation of an address of the memory cell from which data are to be output. The existing semiconductor device reliably performs the amplifying function consuming a small amount of power when the delay time T of the delay circuit 20 matches a propagation time of the Data signal. Therefore, there is desired that the delay circuit 20 is provided so as to meet the aforementioned conditions.

As shown in FIG. 9, the existing semiconductor device has a backup delay circuit 22 provided in a circuit board in order to satisfy the aforementioned requirements. If the sense amplifier 10 is not enabled at a desired timing; namely, if the delay time T generated by the delay circuit 20 is not a desired time, the circuit for propagating the read enable signal is changed to the backup delay circuit 22 by changing a mask used for forming an aluminum wiring layer or a through hole. In the existing semiconductor device, the desired delay time T is ensured by changing the circuit configuration by trial and error under the previously-described method.

However, according to the existing method, it is required to make different prototype circuits by replacing masks over and over again until the configuration of the delay circuit is determined. Consequently, a large cost and much time are required to determine the circuit configuration when the existing method is used in a designing phase of the semiconductor device.

SUMMARY OF THE INVENTION

It is a general object of the present invention to provide a novel and useful semiconductor device, and a novel and useful method of designing the semiconductor.

A more specific object of the present invention is to provide a semiconductor device capable of readily setting a delay time after an elapse of which a sense amplifier is enabled to an appropriate time, as well as a method of designing the semiconductor device.

The above object of the present invention is achieved by a semiconductor device. The semiconductor device includes a sense amplifier which becomes able to amplify a signal when receiving a read enable signal; a delay unit which can provide a plurality of transmission paths having different delay times and which propagates the read enable signal through a transmission path corresponding to a selection signal among the plurality of transmission paths; a selection signal generation circuit capable of generating the plurality of selection signals; and a JTAG boundary scan test circuit which brings the selection signal generation circuit into operation when receiving a instruction.

The above object of the present invention is also achieved by a method of designing a semiconductor device having a sense amplifier which becomes able to amplify a signal when receiving a read enable signal. The method includes the steps of: providing a delay unit capable of formation of a plurality of transmission paths having different delay times and propagating the read enable signal through a transmission path corresponding to a selection signal among the plurality of transmission paths; providing a selection signal generation circuit capable of producing a plurality of selection signals; providing a JTAG boundary scan test circuit which brings the selection signal generation circuit into operation when receiving a instruction; and determining an optimum transmission path having an optimum delay time by evaluating the transmission path selected in accordance with an instruction from the JTAG boundary scan test circuit.

Further object of the present invention is to provide a semiconductor device capable of readily changing a delay time after a elapse of which a sense amplifier is enabled, and capable of readily testing the operation thereof while the sense amplifier is kept in reliably operative.

The above object of the present invention is achieved by a semiconductor device. The semiconductor device includes a sense amplifier which becomes able to amplify a signal when receiving a read enable signal; a delay unit which can provide a plurality of transmission paths having different delay times and which propagates the read enable signal through a transmission path corresponding to a selection signal among the plurality of transmission paths; and an instruction signal generation circuit which supplies to the delay unit, as the instruction signal, an OR result of addition of a predetermined maximum delay instruction signal output for the purpose of taking a transmission path having the maximum delay time as a transmission path for the read enable signal, and an arbitrary selection signal output for the purpose of choosing an arbitrary transmission path as a transmission path for the read enable signal.

Other objects and further features of the present invention will be apparent from the following detailed description when read in conjunction with the accompanying drawings.

BRIEF DESCRIPTION OF THE DRAWINGS

FIG. 10A shows the waveform of a read enable signal to be supplied to a delay circuit from an internal circuit of the existing semiconductor device; and FIG. 10B shows a waveform of a voltage appearing at a node A shown in FIG. 9.

DESCRIPTION OF THE PREFERRED EMBODIMENTS

Figure 1:
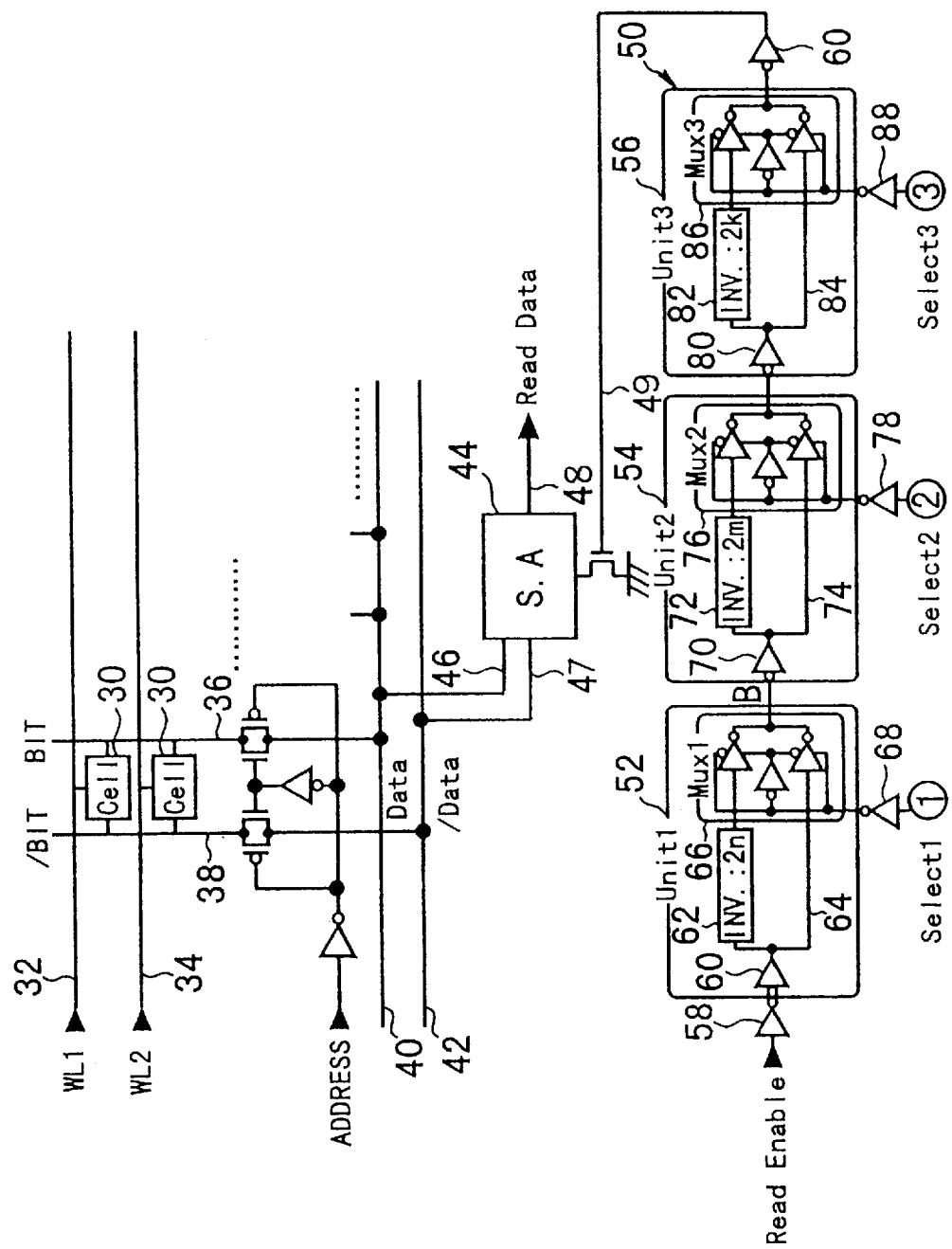
FIGS. 1 and 2 are circuit diagrams showing the principal elements of a semiconductor device according to a first embodiment of the present invention.

In the following, principles and embodiments of the present invention will be described with reference to the accompanying drawings. In the drawings, elements which are common among the drawings are assigned the same reference numerals, and repeated explanations thereof are omitted here.

First Embodiment

Figure 2:
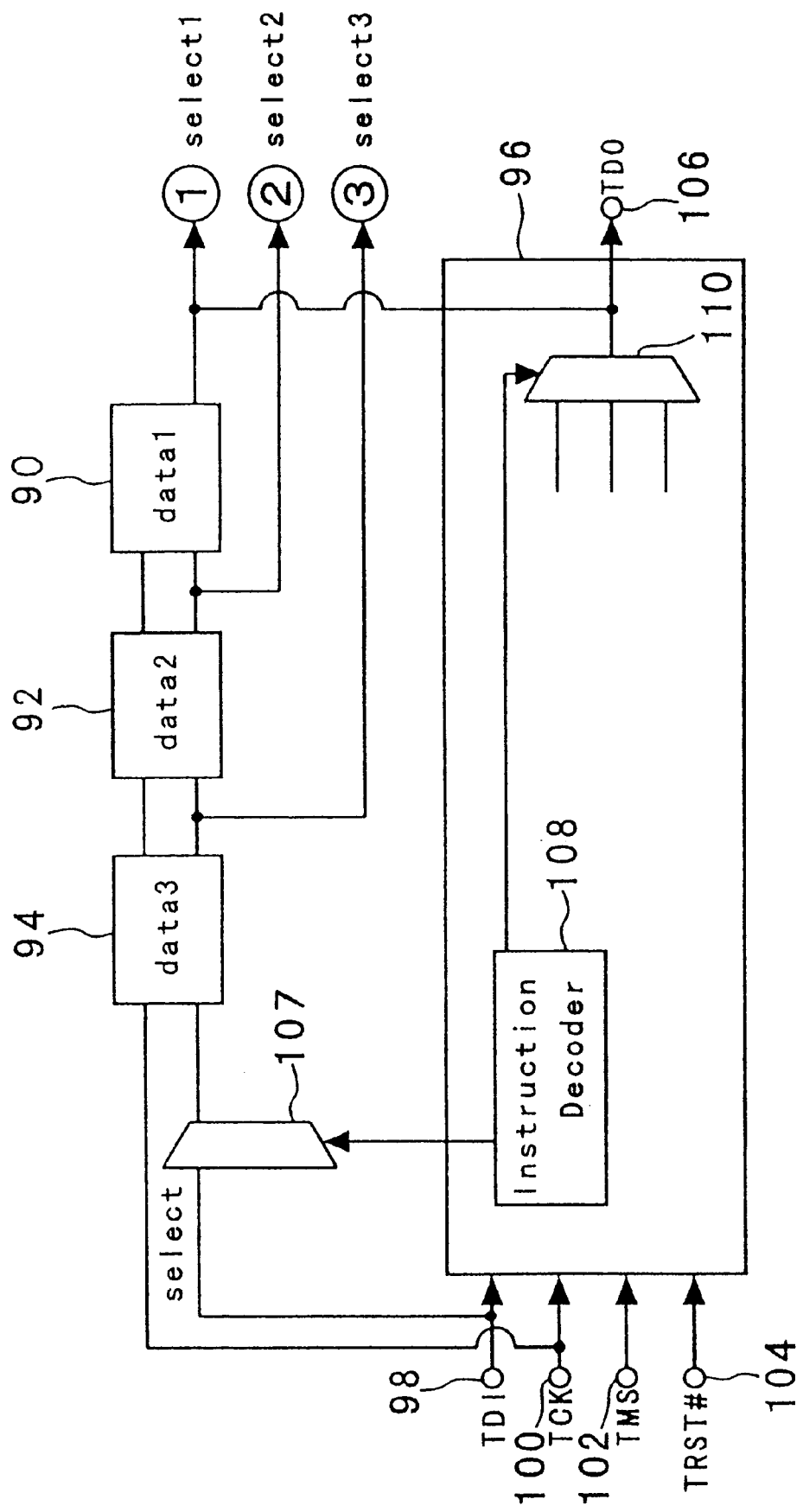

FIGS. 1 and 2 are circuit diagrams showing the principal elements of a semiconductor device according to a first embodiment of the present invention. A semiconductor device according to the first embodiment is a memory IC housed in a BGA (Ball Grid Array) package. As shown in FIG. 1, the semiconductor device according to the first embodiment comprises a plurality of memory cells 30. Each memory cell 30 is connected to two word lines 32, 34 and two bit lines 36, 38.

The semiconductor device has a Data line 40 and an /Data line 42. Data signal and /Data signal are supplied respectively to the Data line 40 and the /Data line 42 from the memory cell 30 that has been addressed. The Data line 40 and the /Data line 42 are connected to a non-inverted input terminal 46 and an inverted input terminal 47 of a sense amplifier 44.

The sense amplifier 44 has an output terminal 48 and an enable terminal 49. When a high signal is supplied to the enable terminal 49, the sense amplifier 44 becomes enabled or operative amplifies the differential voltage between the Data terminal 46 and the /Data terminal 48, and outputs the thus-amplified signal.

The enable terminal 49 of the sense amplifier 44 is connected to a delay circuit 50. The delay circuit 50 comprises first through third delay units 52, 54, 56 and two inverter circuits 58, 60. The three delay units 52, 54, 56 and the two inverter circuits 58, 60 are connected in series. The inverter circuit 58 provided on the input side end of the delay circuit 50 receives a read enable signal from an unillustrated read enable signal generation circuit. In the semiconductor device according to the present embodiment, the read enable signal is switched from a low state to a high state at a predetermined time at which data are to be read from the memory cell.

The first delay unit 52 includes the inverter circuit 60. The inverter circuit 60 is connected to an inverter chain 62 and a transmission line 64 which are provided in parallel. The inverter chain 62 comprises 2n inverters connected in series. The inverter chain 62 and the transmission line 64 are connected to a multiplexer 66.

The first delay unit 52 is connected to an inverter circuit 68 at an input terminal of the multiplexer 66. As will be described later, a first selection signal is supplied to the inverter circuit 68. When the first selection signal is high, the multiplexer 66 outputs to a second delay unit 54 a signal to be propagated through the inverter chain 62. In contrast, when the first selection signal is low, the signal flowing through the transmission line 64 is output to the second delay unit 54.

The second delay unit 54 comprises an inverter circuit 70, an inverter chain 72, a transmission line 74, and a multiplexer 76. The inverter chain 72 comprises 2m inverters connected in series. The second delay unit 54 is connected to an inverter circuit 78 which transmits a second selection signal to the multiplexer 76. The second delay unit 54 operates according to the state of the second selection signal and supplies to a third delay unit a signal which passes through the inverter chain 72 or the transmission line 74.

A third delay unit 56 comprises an inverter circuit 80, an inverter chain 82, a transmission line 84, and a multiplexer 86. The inverter chain 82 comprises 2k inverters connected in series. Further, the second delay unit 56 is connected to a inverter circuit 88 which transmits a third selection signal to the multiplexer 86. The third delay unit 56 operates according to the state of the third selection signal and supplies to the inverter circuit 60 a signal which passes through the inverter chain 82 or the transmission line 84.

The semiconductor device according to the first embodiment comprises first through third registers 90, 92, and 94 shown in FIG. 2. The first through third registers 90, 92, and 94 are connected in series with one another. A signal supplied to the third register 94 is transmitted into the third register 94, the second register 92, and the first register 90 in that order every time a clock signal is input to the first through third registers 90, 92, and 94. In the semiconductor device, the signals output from the first through third registers 90, 92, and 94 are delivered as the foregoing first through third selection signals to the inverter circuit 68, 78, and 88; namely, the first through third delay units 52, 54, and 56.

As shown in FIG. 2, the semiconductor device according to the first embodiment comprises a JTAG boundary scan test circuit 96. The JTAG boundary scan test circuit 96 is a subset complying with IEEE1149.1a and is primarily intended to detect faulty soldering of a BGA package when the package is assembled on a processor board.

The JTAG boundary scan test circuit 96 comprises a test data input terminal TDI 98, a test clock terminal TCK 100, a test mode selector terminal TMS 102, a test reset terminal TRST 104, and a test data output terminal TDO 106. A clock input terminal of the third register 94 is electrically connected with the test clock terminal TCK 100. An output terminal of the first register 90 is electrically connected with the test data output terminal TDO 106. Further, the signal input terminal of the third register 94 is electrically connected with the test data input terminal TDI 98 by way of a multiplexer 107.

The JTAG boundary scan test circuit 96 includes functional circuits, such as an instruction decoder 108 and a multiplexer 110. The multiplexer 107 provided between the signal input terminal of the third register 94 and the test data input terminal TDI 98 supplies to the third register 94 test data to be input to the test data input terminal TDI 98 according to an instruction from the instruction decoder 108.

The JTAG boundary scan test circuit 96 is provided with an undefined mode which permits the user to freely create definition. In the first embodiment, one undefined mode of the JTAG boundary scan circuit 96 is assigned to a selection signal setting mode. When the selection signal setting mode is selected at the time of instruction setting of the JTAG boundary scan test circuit 96, the instruction decoder 108 brings the multiplexer 107 into operation.

In this state, every time a clock signal is input to the test clock terminal TCK 100, the test data input from the test data input terminal TDI 98 can be transmitted into the third register 94, the second register 92, and the first register 90 in that order. Accordingly, in the semiconductor device according to the first embodiment, the first through third selection signals can be arbitrarily changed by selecting a selection signal setting mode at the time of instruction setting of the JTAG boundary scan circuit 96.

Figure 3:
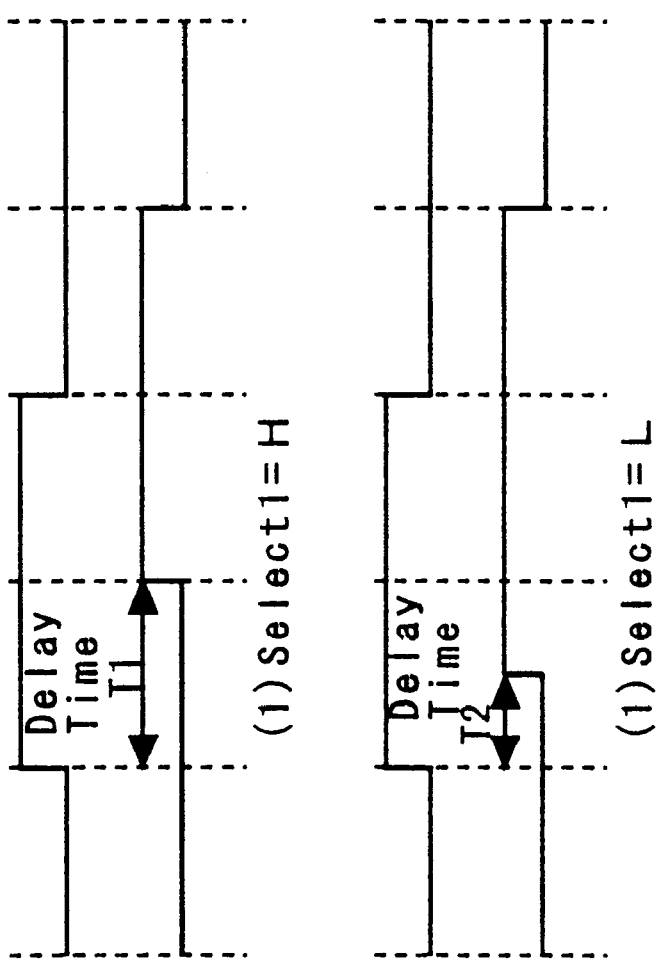
FIGS. 3A and 3C show the waveform of a read enable signal supplied to the delay circuit shown in FIG. 1.
FIG. 3B shows the waveform of a signal appearing at node B shown in FIG. 1 when a first selection signal is high.
FIG. 3D shows the waveform of the signal appearing at node B shown in FIG. 1 when the first selection signal is low.

The operation of the semiconductor device according to the first embodiment will now be described by reference to FIG. 3.

FIG. 3A shows a waveform of a read enable signal input to the inverter circuit 58 of the delay circuit 50. FIG. 3B shows a waveform of a signal appearing at a node B shown in FIG. 1, i.e., an output terminal of the first delay unit 52 when the first selection signal is high. FIG. 3C shows a waveform of a read enable signal input to the inverter circuit 58 of the delay circuit 50. FIG. 3D shows a waveform of a signal appearing at the node B shown in FIG. 1 when the first selection signal is low.

As mentioned previously, when the first selection signal is high, the signal, which has passed through the inverter chain 62, enters the output terminal of the first delay unit 52. In this case, as shown in FIGS. 3A and 3B, there arises a comparatively long delay time T1 after the read enable signal changes from a low state to a high state and before the electric potential of the node B changes from a low state to a high state as a result that the signal has passed through the inverter chain 62.

In contrast, in a case where the first selection signal is low, the signal, which has passed through the transmission line 64, enters the output terminal of the first delay unit 52. In this case, since the signal does not pass through the inverter chain 62, there arises a comparatively short delay time T2 after the read enable signal changes from a low state to a high state and before the electric potential of the node B changes from a low state to a high state.

As mentioned above, the semiconductor device according to the first embodiment enables to switch the delay time determined by the first delay unit 52 in two steps according to the value of the first selection signal. Similarly, the semiconductor device according to the first embodiment enables to switch the delay time determined by the second delay unit 54 and the delay time determined by the third delay unit 56 in two steps according to the respective values of the second selection signal and the third selection signal. Accordingly, in the semiconductor device according to the first embodiment, the delay time determined by the delay circuit 50 can be readily switched in eight steps by suitably changing the values of the first through third selection signals.

In the semiconductor device according to the first embodiment, there is desired that the delay time determined by the delay circuit 50 is set in such a way as to bring the sense amplifier 44 into operation at an appropriate timing. More specifically, there is desired that the delay time is set in such way as to bring the sense amplifier 44 into operation at a timing at which the data signal output from the memory cell 30 arrives at the sense amplifier 44 during the operation of the semiconductor device.

To meet the foregoing requirements, it is preferable that the delay time determined by the delay circuit 50 can be readily changed in many steps. In this respect, the configuration of the semiconductor device according to the first embodiment is advantageous in readily adjusting the delay time afforded to the read enable signal to an optimum value. There will now be described a method of determining the circuit configuration of the semiconductor device through use of the foregoing advantage.

Figure 4:
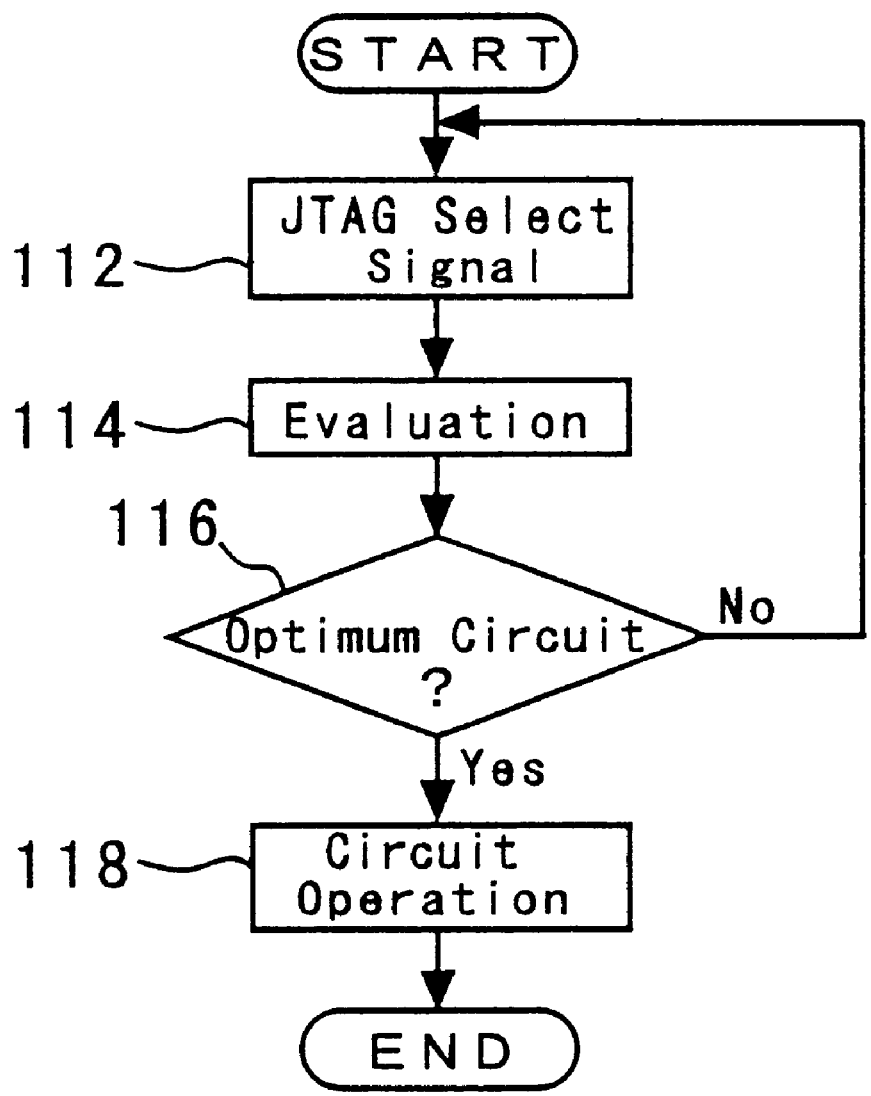
FIG. 4 is a flowchart showing a series of processing operations to be performed during a phase of determining the circuit configuration of the semiconductor device according to the first embodiment.

FIG. 4 is a flowchart related to a method of determining the circuit configuration of the semiconductor device according to the first embodiment. A series of steps shown in FIG. 4 is performed during the phase of determining the circuit configuration of the semiconductor device. In the series of steps shown in FIG. 4, processing related to step 112 is first performed.

In step 112, the first through third selection signals are set to arbitrary values by utilizing the JTAG boundary scan circuit 96. After the execution of the processing related to step 112, the delay circuit 50 generates the delay time corresponding to a combination of preset selection signals.

In step 114, the delay circuit 50 set through the processing performed in step 112 is evaluated. In step 114, the delay circuit 50 is regarded higher, as the sense amplifier 44 can read the data output from the memory cell 30 with higher reliability and the semiconductor device can output the data at higher speed.

In step 116, a decision is made as to whether or not an optimum delay circuit is determined. As a result, in a case where it is decided that an optimum delay circuit has not yet been determined, the processing related to step 112 is performed again. In contrast, in a case where it is decided that the optimum delay circuit has already been determined, processing related to step 118 is performed.

In step 118, circuit operations are performed so that the read enable signal always pass through the optimum delay circuit determined in step 116. As a result of the foregoing processing operations, the process for determining the circuit configuration of the semiconductor device ends. In a subsequent process, the semiconductor device is manufactured so that the circuit configuration determined in the manner as mentioned above is provided. The previously-described processing enables easy determination of an optimum structure for the configuration of the delay circuit of the semiconductor device, by utilizing the function of the JTAG boundary scan circuit. Accordingly, the technique according to the first embodiment of the present invention enables easy and inexpensive manufacture of a semiconductor device which operates at high speed and has superior power-saving characteristics.

Although in the first embodiment the three delay units 52, 54, and 56 are used for the delay circuit 50, the present invention is not limited to such a configuration. The number of delay units to be used for the delay unit 50 can be determined arbitrary.

Second Embodiment

A semiconductor device according to a second embodiment of the present invention will now be described by reference to FIGS. 5 through 8.

Figure 5:
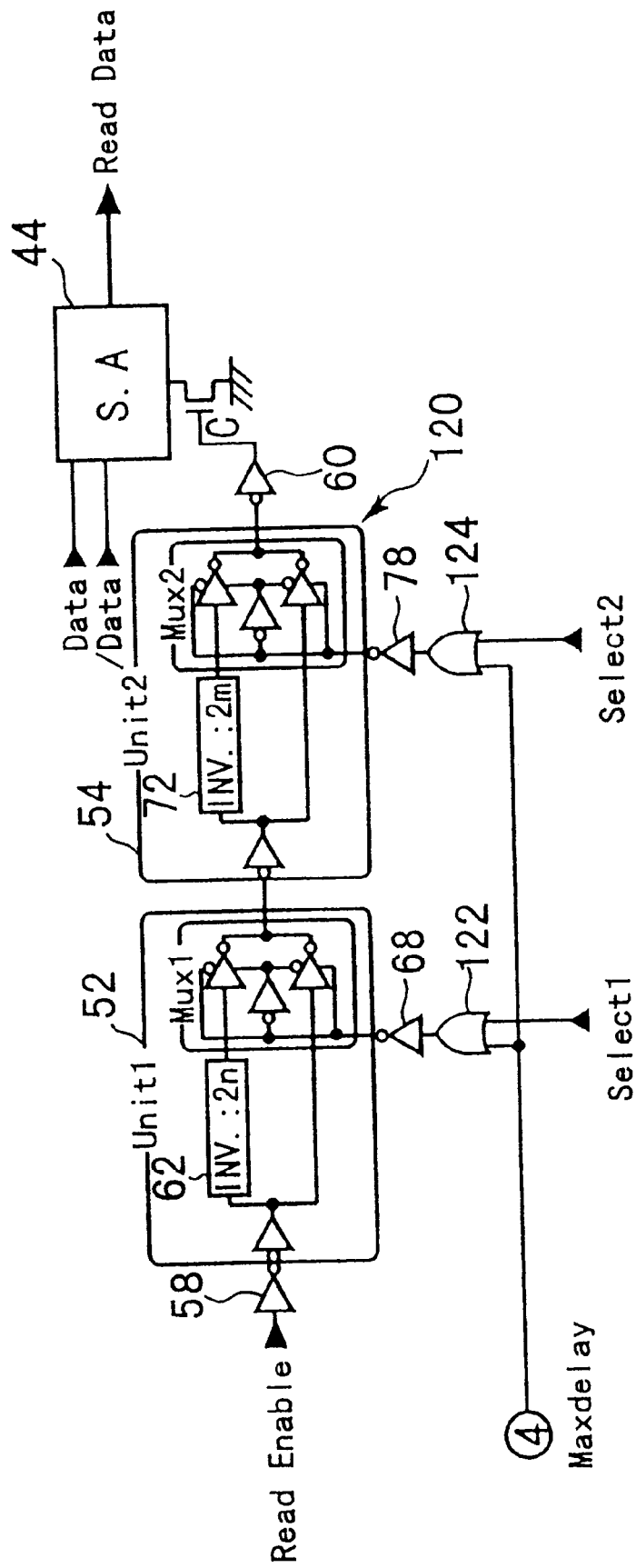
FIGS. 5 and 6 are circuit diagrams showing the principal elements of a semiconductor device according to a second embodiment of the present invention.
Figure 6:
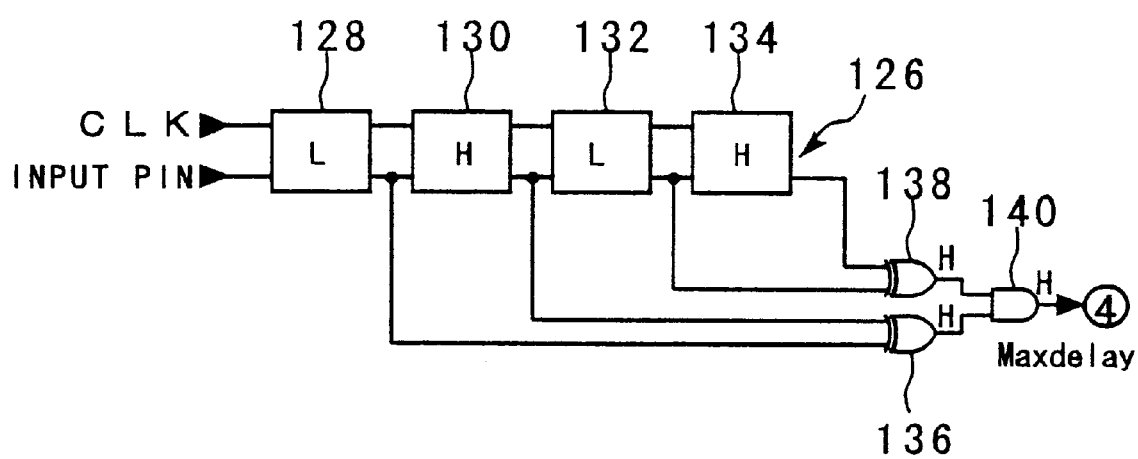

FIGS. 5 and 6 are circuit diagrams showing the principal elements of the semiconductor device according to the second embodiment. In FIGS. 5 and 6, the elements which are identical with the constituent elements shown in FIGS. 1 and 2 are assigned the same reference numerals, and repeated explanations thereof will be omitted or simplified.

As shown in FIG. 5, the semiconductor device according to the second embodiment has a delay circuit 120. The delay circuit 120 is implemented by two inverter circuits 58, 60 and first and second delay units 52, 54 which are connected in series. Further, the first and second delay units 52, 54 are connected to the inverter circuits 68, 78, respectively.

A read enable signal produced by the semiconductor device is supplied to the inverter circuit 58 disposed on the input-side end of the delay circuit 120. The inverter circuit 60 provided on the output-side end of the delay circuit 120 is connected to the sense amplifier 44. With the foregoing configuration, the delay time of the read enable signal can be changed in four ways by changing the instruction signals supplied to the first and second delay units 52, 54 by way of the inverter circuits 68, 78.

In the semiconductor device according to the second embodiment, the inverter circuits 68, 78 are connected to OR circuits 122, 124, respectively. The OR circuit 122 receives a maximum delay instruction signal Maxdelay and a first selection signal, and the OR circuit 124 receives the maximum delay instruction signal Maxdelay and a second selection signal.

FIG. 6 shows a signal generation circuit 126 for producing the maximum delay instruction signal Maxdelay. The two OR circuits 122, 124 receives the maximum delay instruction signal Maxdelay produced by the signal generation circuit 126 shown in FIG. 6. The signal generation circuit 126 comprises the first through fourth registers 128, 130, 132,and 134. The first register 128 is connected to the input pin of the semiconductor device. The first through fourth registers 128, 130, 132, and 134 sequentially transmit the signals input by way of input pins in synchronism with a clock signal of the semiconductor device.

Figures 7A, 7B:
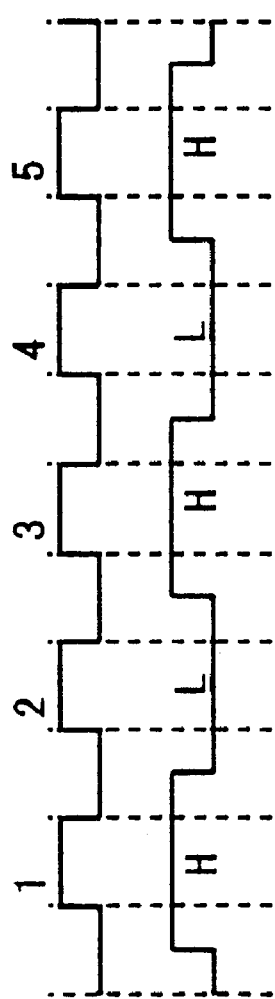
FIG. 7A shows the waveform of a clock signal supplied to the signal generation circuit shown in FIG. 6.
FIG. 7B shows the waveform of a signal supplied to an input pin of the signal generation circuit shown in FIG. 6 for the purpose of bringing a maximum delay instruction signal into a high state.

FIG. 7A shows a waveform of the clock signal of the semiconductor device, and FIG. 7B shows a waveform of a signal input to an input pin for bringing the maximum delay instruction signal Maxdelay into a high state. As shown in FIGS. 7A and 7B, in a case where an attempt is made to bring the maximum delay instruction signal Maxdelay into a high state, a signal which is inverted between a high state and a low state every one cycle of the clock signal is supplied to the input pin.

The first through fourth registers 128, 130, 132, and 134 shown in FIG. 6 detect the up edge of the clock signal and acquire a signal from an input pin or a register of a previous stage. Accordingly, in a case where a signal as shown in FIG. 7B is supplied to the input pin, the first through fourth registers 128, 130, 132, and 134 alternately latch high and low signals every clock cycle.

In the signal generation circuit 126 shown in FIG. 6, the signals output from the first and second registers 128 and 130 are supplied to an exclusive OR circuit (XOR circuit) 136. Similarly, the signals output from the third and fourth registers 132, 134 are supplied to an XOR circuit 138. The signals output from the XOR circuits 136, 138 are supplied to an AND circuit 140.

In a case where the first through fourth registers 128 to 134 alternately latch high and low signals, both of the signals output from the XOR circuits 136, 138 become high. Consequently, in this case, the signal output from the AND circuit 140, i.e., the maximum delay instruction signal Maxdelay, becomes high. In contrast, when the inputting of a signal as shown in FIG. 7B to the input pin is stopped, the two adjacent registers latch the same level signals. In this case, the Maxdelay signal output from the AND circuit becomes low. As mentioned above, the semiconductor device according to the second embodiment enables the maximum delay instruction signal Maxdelay to be set to a high or low signal, according to whether or not the signal shown in FIG. 7B is supplied to the input pin of the signal generation circuit 126.

In the semiconductor device according to the second embodiment, the first delay unit 52 supplies a signal which passes through the inverter chain 62 to a circuit on a subsequent stage when the maximum delay instruction signal is high. Similarly, in this case, the second delay unit 54 outputs a signal which passes through the inverter chain 72 to a circuit on the subsequent state. Accordingly, the delay circuit 120 always produces the maximum delay time without regard to the state of the first and second selection signals when the maximum delay instruction signal Maxdelay is high.

In the semiconductor device according to the second embodiment, so long as the delay time of the delay circuit 120 is set to the maximum time, undesired early enabling of the sense amplifier 44 can be prevented unfailingly. Accordingly, when the delay time of the delay circuit 120 is set to the maximum time, the sense amplifier 44 can reliably amplify the Data and /Data signals received from the individual memory cells.

As in the case of the first embodiment, the delay time of the delay circuit 120 of the semiconductor device is desirably as short as possible, within the extent to which an output from every memory cell can be reliably amplified by the sense amplifier 44. In the semiconductor device according to the second embodiment, the foregoing requirements can be readily satisfied by appropriate setting of the first and second selection signals.

In contrast, in order to accurately test the state of a memory cell in the semiconductor device, the test is desirably carried out under circumstances where the sense amplifier 44 reliably amplifies a signal received from the memory cell. The semiconductor device according to the second embodiment can readily satisfy the foregoing requirements by bringing the maximum delay instruction signal Maxdelay into a high state. For this reason, the semiconductor device according to the second embodiment can readily achieve a function of readily setting of an optimum delay time and a function of readily setting of a condition which is suitable for accurately testing of the memory cell.

An explanation will now be given of a method of testing whether the semiconductor device is defective or non-defective by utilizing the advantages of the semiconductor device according to the second embodiment.

Figure 8:
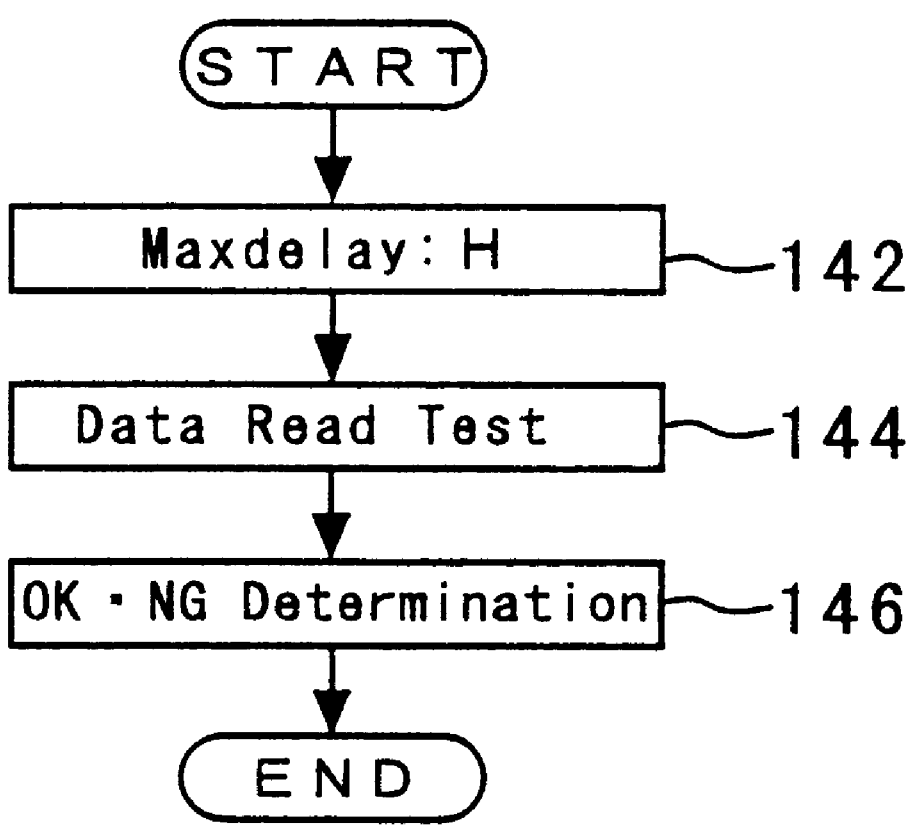
FIG. 8 is a flowchart showing a series of processing operations to be performed during a process of testing the semiconductor device according to the second embodiment.
Figure 9:
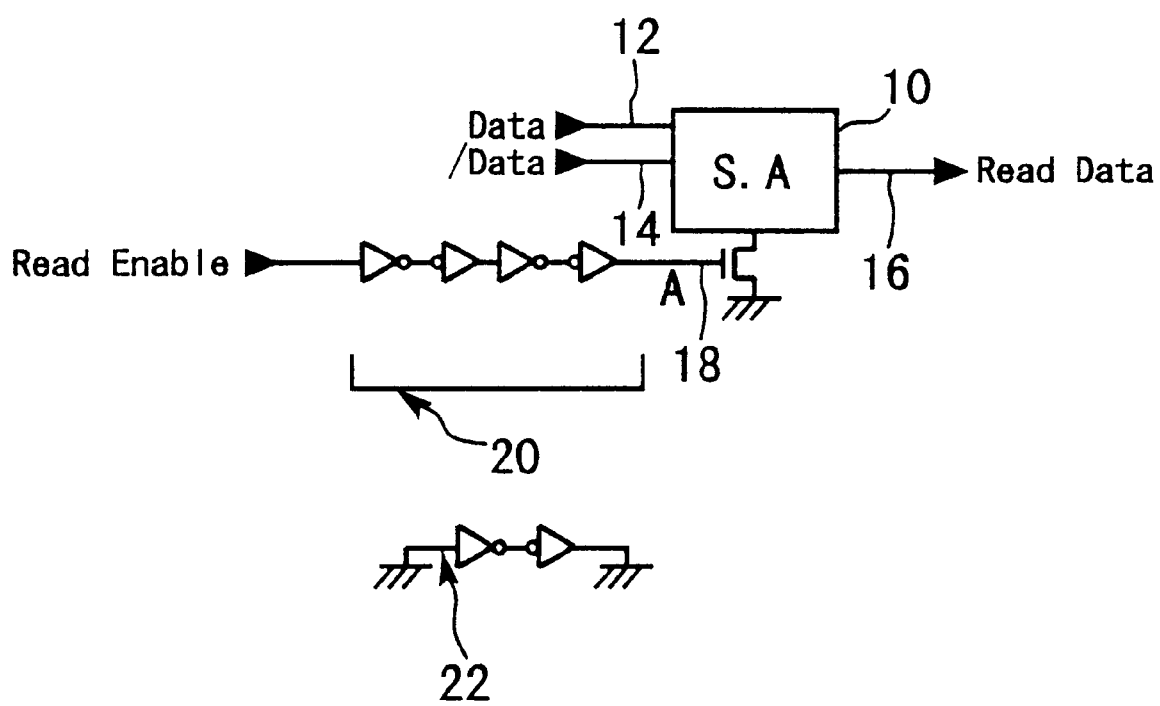
FIG. 9 is a circuit diagrams showing a sense amplifier 10 and other elements of an existing semiconductor device.

FIG. 8 is a flowchart of a series of processing operations performed during a testing process of the semiconductor device according to the present embodiment. A series of processing operations shown in FIG. 8 is performed in order to test the state of a memory cell during the processes of manufacturing a semiconductor device. In the series of processing operations shown in FIG. 8, the processing related to step 142 is performed first.

In step 142, there is performed a processing operation for bringing the maximum delay instruction signal Maxdelay to a high state. More specifically, there is performed a processing operation for inputting a signal such as that shown in FIG. 7B to the input pin of the signal generation circuit 126.

In step 144, there is performed a read test of a data signal which is to be output from the sense amplifier 44.

In step 146, there is determined whether a corresponding memory cell is defective or non-defective, on the basis of the decision as to whether or not the data signal read in step 144 is appropriate. Through these operations, the checking of a single memory cell is completed. Subsequently, all the memory cells can be readily and accurately checked by repeatedly performing the processing related to steps 144 and 146.

As mentioned previously, the semiconductor device according to the second embodiment has a function of being able to readily change the delay time of the delay circuit 120 by appropriately changing the first and second selection signals. Accordingly, the semiconductor device according to the second embodiment enables inexpensive determination of the optimum circuit configuration in a short time at a phase of determining a circuit configuration.

Although in the second embodiment a JTAG boundary scan circuit is not built into the semiconductor device, the present invention is not limited to such a configuration. In a case where a semiconductor device is housed in a BGA package, the JTAG boundary scan circuit may be built into a semiconductor device.

Since the present invention has been configured as mentioned previously, the invention yields the following advantageous results.

According to the first aspect of the present invention, an optimum delay circuit configuration can be readily determined by utilizing the function of a JTAG boundary scan circuit during a phase of determining the circuit configuration of a semiconductor device.

According to the second aspect of the present invention, a selection signal of a predetermined number of bits can be readily produced, namely, the configuration of a delay circuit can be readily changed by utilizing an input terminal of the JTAG boundary scan circuit.

According to the third aspect of the present invention, there can be achieved a function of readily determining the optimum delay circuit configuration and a function of readily providing a condition suitable for accurately checking a memory cell.

According to the fourth aspect of the present invention, the state of a circuit upstream of a sense amplifier can be readily checked by utilizing of the advantage of the semiconductor device according to the present invention.

Further, the present invention is not limited to these embodiments, but variations and modifications may be made without departing from the scope of the present invention.

What is claimed is:

1. A semiconductor device comprising:
    a sense amplifier which becomes able to amplify a signal when receiving a read enable signal;
    a delay unit which can provide a plurality of transmission paths having different delay times and which propagates the read enable signal through a transmission path corresponding to a selection signal among the plurality of transmission paths;
    a selection signal generation circuit capable of generating the plurality of selection signals; and
    an JTAG boundary scan test circuit which brings the selection signal generation circuit into operation when receiving a instruction.

2. The semiconductor device as defined in claim 1, wherein the sense amplifier amplifies a signal output from a memory cell.

3. The semiconductor device as defined in claim 1, wherein the selection signal generation circuit comprises a register which produces the selection signal of a predetermined number of bits when receiving a signal supplied to a signal input terminal of the JTAG boundary scan test circuit.

4. A method of designing a semiconductor device having a sense amplifier which becomes able to amplify a signal when receiving a read enable signal, the method comprising the steps of:
    providing a delay unit capable of formation of a plurality of transmission paths having different delay times and propagating the read enable signal through a transmission path corresponding to a selection signal among the plurality of transmission paths;
    providing a selection signal generation circuit capable of producing a plurality of selection signals;
    providing a JTAG boundary scan test circuit which brings the selection signal generation circuit into operation when receiving an instruction; and
    determining an optimum transmission path having an optimum delay time by evaluating the transmission path selected in accordance with an instruction from the JTAG boundary scan test circuit.

5. The method of designing a semiconductor device as defined in claim 4, further comprising a step of performing a circuit processing operation so that the delay unit always propagates the read enable signal through the optimum transmission path after determination of the same.

6. The method of designing a semiconductor device as defined in claim 4, wherein the sense amplifier amplifies a signal output from a memory cell.

7. The method of designing a semiconductor device as defined in claim 4, wherein the selection signal generation circuit comprises a register which generates the selection signal of a predetermined number of bits when receiving a signal supplied to a signal input terminal of the JTAG boundary scan test circuit.

8. A semiconductor device comprising:
    a sense amplifier which becomes able to amplify a signal when receiving a read enable signal;

a delay unit which can provide a plurality of transmission paths having different delay times and which propagates the read enable signal through a transmission path corresponding to a selection signal among the plurality of transmission paths; and an instruction signal generation circuit which supplies to the delay unit, as the instruction signal, an OR result of addition of a predetermined maximum delay instruction signal output for the purpose of taking a transmission path having the maximum delay time as a transmission path for the read enable signal, and an arbitrary selection signal output for the purpose of choosing an arbitrary transmission path as a transmission path for the read enable signal.

9. The semiconductor device as defined in claim 8, wherein the sense amplifier amplifies a signal output from a memory cell.

10. The semiconductor device as defined in claim 8, further comprising a maximum delay instruction signal generation circuit which generates the maximum delay instruction signal when receiving a signal.

11. The semiconductor device as defined in claim 10, further comprising a selection signal generation circuit capable of generating a plurality of selection signals; and a JTAG boundary scan test circuit which brings the selection signal generation circuit into operation in accordance with an instruction.

\* \* \* \* \*